US009830355B2

(12) United States Patent
Pagh

(10) Patent No.: US 9,830,355 B2
(45) Date of Patent: Nov. 28, 2017

(54) COMPUTER-IMPLEMENTED METHOD OF PERFORMING A SEARCH USING SIGNATURES

(71) Applicant: ITU Business Development A/S, Hjärup (DK)

(72) Inventor: Rasmus Pagh, Hjärup (SE)

(73) Assignee: ITU Business Development A/S, Copenhagen S (DK)

( * ) Notice: Subject to any disclaimer, the term of this patent is extended or adjusted under 35 U.S.C. 154(b) by 0 days.

(21) Appl. No.: 15/186,080

(22) Filed: Jun. 17, 2016

(65) Prior Publication Data

US 2016/0371331 A1    Dec. 22, 2016

(30) Foreign Application Priority Data

Jun. 19, 2015  (DK) .................................. 2015 70376

(51) Int. Cl.
| | | |
|---|---|---|
| *G06F 17/30* | (2006.01) | |
| *G06F 17/00* | (2006.01) | |
| *H03M 13/15* | (2006.01) | |

(52) U.S. Cl.
CPC .. *G06F 17/30466* (2013.01); *G06F 17/30303* (2013.01); *G06F 17/30486* (2013.01); *H03M 13/1575* (2013.01)

(58) Field of Classification Search
CPC ........... G06F 17/30864; G06F 17/3002; G06F 17/30784; G06F 17/30598; G06F 17/30038; G06F 17/3033; G06F 17/30799; G06F 17/30949; G06F 21/564; G06F 17/30587; G06F 3/04842; G06F 17/2235; G06F 17/30787; G06F 17/30802; G06F 17/30867; G06F 17/5009; G06F 17/30734; G06F 17/3097; G06F 19/14; G06F 19/24; G06F 11/008; G06F 17/212; G06F 17/248;
(Continued)

(56) References Cited

U.S. PATENT DOCUMENTS 6,526,091 B1 *  2/2003  Nystrom ................. H04J 13/16
                                                370/209
6,675,174 B1 *  1/2004  Bolle ................ G06F 17/30802
(Continued)

OTHER PUBLICATIONS

Ghani, Rayid, "Using Error-Correcting Codes for Text Classification," Proceeding ICML '00 Proceedings of the Seventeenth International Conference on Machine Learning, 2000, 26 pages.
(Continued)

*Primary Examiner* — Yicun Wu
(74) *Attorney, Agent, or Firm* — Morrison & Foerster LLP

(57) ABSTRACT

A computer-implemented method of processing a query vector and a data vector), comprising: generating a set of masks and a first set of multiple signatures and a second set of multiple signatures by applying the set of masks to the query vector and the data vector, respectively, and generating candidate pairs, of a first signature and a second signature, by identifying matches of a first signature and a second signature. The set of masks comprises a configuration of the elements that is a Hadamard code; a permutation of a Hadamard code; or a code that deviates from a Hadamard code or a permutation of a Hadamard code in less than 40% of its elements.

13 Claims, 5 Drawing Sheets

(58) Field of Classification Search
CPC ......... G06F 17/30259; G06F 17/30321; G06F 17/30536; G06F 17/30825; G06F 17/30837; G06F 17/3084; G06F 17/30858; G06F 17/3089; G06F 17/30961
See application file for complete search history.

(56) References Cited

U.S. PATENT DOCUMENTS

| | | |
|---|---|---|
| 7,865,505 B2 | 1/2011 | Arasu et al. |
| 2004/0093320 A1 | 5/2004 | Shin |
| 2008/0183693 A1 | 7/2008 | Arasu |
| 2009/0157601 A1* | 6/2009 | Lee ................ G06F 17/3002 |
| 2009/0210418 A1 | 8/2009 | Arasu et al. |
| 2012/0130972 A1* | 5/2012 | Ahn ............... G06F 17/30675 |
| | | 707/706 |
| 2013/0311445 A1 | 11/2013 | Narita |
| 2015/0036883 A1* | 2/2015 | Deri ................ G06K 9/00771 |
| | | 382/103 |

OTHER PUBLICATIONS

Intention to Grant received for DK PA201570376, dated Feb. 4, 2016, 7 pages.
International-Type Search Report received for DK PA201570376, dated Mar. 10, 2016, 14 pages.
Wang, Jingdong et al., "Hasing for Similarity Search: A Survey," Aug. 14, 2014, 30 pages.

\* cited by examiner

COMPUTER-IMPLEMENTED METHOD OF PERFORMING A SEARCH USING SIGNATURES

CROSS-REFERENCE TO RELATED APPLICATION

This application claims priority to Danish Application PA201570376 filed on Jun. 19, 2015, the entire contents of which are incorporated herein by reference.

TECHNICAL FIELD

Computing and network technologies have become all-pervasive technologies that are implemented as general purpose systems, as special purpose systems, or embedded as system components dedicated to selected purposes. In many cases the computer-implemented task of searching for data or identifying similarity among data is an important and repeatedly used task. In general, improvements related to faster processing speeds and lower memory or storage consumption are highly appreciated since such improvement often leads to directly improved performance of an overall system or application.

It is evident that data searching technologies support natural language searches against search engines such as those available on the Internet and database queries in general including queries for cleaning stored data. However, data searching is also widely used in different types of algorithms in various technical areas. There is a gradual transition from search to data cleaning. In general, searching and cleaning is performed against a (clean) data set or collection of data vectors. When searching, a query can be represented as a vector, whereas in data cleaning, non-clean data have multiple representations as vectors.

Data cleaning is an essential step in populating and maintaining databases. A very important data cleaning operation is that of "joining" similar data. That is, two or more sets of data which are not exactly identical (e.g. due to spelling mistakes), but which sensibly should be. In these situations, it would be desirable to perform so-called similarity joins to join these data sets.

This problem of joining similar data elements has been studied intensively. The task of joining similar data elements is also relevant when identifying, for a given record, the best few approximate matches from among a reference set of records. The similarity join is the fundamental operation upon which many of these techniques are built. Similarity joins are also used in connection with the computer-implemented task of measuring similarity among documents.

Data cleaning based on similarities involves identification of "closely related" data elements, where "closely related" is evaluated using a variety of similarity functions chosen to suit the task at hand. Then "closely related" data elements can be joined or merged.

Searching can also be based on similarities and involve identification of "closely related" data elements to provide a response to a query for data elements closely related to the query.

In order to compute a similarity join with a so-called sub-quadratic technique, candidate pairs of a first data set and a second data set are generated via a technique known as a signature-based approach. In a signature-based approach a collection of a set of respective signatures are generated for a first set of data (say a query vector) and for a second set of data (say a data vector) that are investigated for being similar. The signatures generated have the property that if a similarity function that measures the similarity between first set of data and the second set of data yields a similarity above a predefined threshold, then the sets of respective signatures share a common (identical) signature. Thus, exact searches are performed in the signature sets. However, signature-based approaches increase the number of exact searches that have to be performed, which yields longer processing times for processing a search and means that more memory is consumed to store the signatures. Signature-based approaches that generate many signature sets per data vector (or query vector) yield what is called a strong filtering, whereas few signature sets per data vector (or query vector) yields alight filtering.

Signatures or signature sets are generated by applying a set of masks to the data to thereby for each mask select particular elements of the data. In general, a mask conventionally comprises a set of multiple binary vectors of the same dimension as the data vectors. The signature of a data vector is the set of these binary vectors applied to the data vector.

For instance a mask with a matrix structure of d columns and t rows can be applied to a data vector (row) with length d to generate a signature with d columns and t rows. When applied, the mask generates sets of signatures by sampling the data vector differently as defined by the pattern of the mask.

The signatures generated from say a query (or data) are then searched for among the signatures generated from data. The result of this exact search in the set of signatures is called a candidate or a candidate pair.

In the prior art there is a trade-off between light filtering which generates many candidate pairs and thus comes with a cost in performing many exact comparisons versus strong filtering which produces few candidate pairs and thereby unfortunately requires long processing times in generating the candidate pairs.

RELATED PRIOR ART

In general, a variety of similarity functions have been considered, such as edit distance, Jaccard similarity, cosine similarity, and generalized edit distance for measuring similarities. However, no single similarity function is known to be the overall best similarity function, and the choice usually depends on the application domain.

U.S. Pat. No. 7,865,505 (Arasu et al.) discloses a computer-implemented method that facilitates and effectuates exact similarity joins (more specifically set similarity joins or SSJoin) between collections of sets based on a signature-based approach. The method is disclosed in the context of data cleaning and obtains a collection of sets and a threshold value from an interface. Based on an identifiable similarity, such as an overlap or intersection, between the collection of sets, an analysis component generates and outputs as a candidate pair every pair of vectors (x,y) in the first and second set whose similarity equals or exceeds the threshold value. More specifically Arasu et al.'s contribution to the art is to generate signatures from a sequence of vector masks that is applied in (or split into) partitions in smaller dimensions.

Thereby, Arasu et al. have devised a method that generates multiple partitions and as a consequence thereof their method can make do with computation of fewer masks and signature sets. Arasu's et al. method is also denoted PartEnum. It is a characteristic of PartEnum that it guarantees that every pair of vectors (x,y) whose distance is smaller than a predefined threshold, k, will become a candidate pair. This means that the recall of the method is 100%.

However, the above-mentioned trade-off still exists and hence there remains a trade-off between light filtering which produces many candidate pairs (and thus requires processing time to compute distance) versus strong filtering which produces few candidate pairs and thereby unfortunately requires long processing times in generating the candidate pairs.

For the sake of completeness it is mentioned that there exists a family of filtering methods, often referred to as locality-sensitive hashing (LSH) that also works by generating candidate pairs of vectors. However, in contrast to PartEnum and the method described below, these (LSH) methods do not have a recall of 100%, that is, they may fail to identify close pairs. Furthermore, this limitation is inherent to these methods since they work by independent repetition of a candidate generation step that has low recall. Locality-sensitive hashing methods are surveyed in Wang et al. (Hashing for Similarity Search: A Survey, Aug. 14, 2014, by Jingdong Wang et al.) which can be consulted for details.

SUMMARY

An objective is to improve the performance in computing similarity joins for a given trade-off between light filtering which produces many candidate pairs contra strong filtering which produces few candidate pairs.

There is provided a computer-implemented method of processing a first vector and a second vector, comprising receiving the first vector and the second vector; generating a set of masks; wherein the set of masks comprises first elements and second elements; generating a first set of multiple signatures and a second set of multiple signatures by applying the set of masks to the first vector and the second vector, respectively; generating candidate pairs, of a first signature and a second signature, by identifying matches of a first signature and a second signature; wherein the set of masks comprises a configuration of the elements that is one or more of the following:
a Hadamard code;
a permutation of a Hadamard code;
a code that deviates from a Hadamard code or a permutation of a Hadamard code in less than 40% of its elements.

Consequently, fewer signatures are required for a predefined level of filtering, which in turn reduces the computational effort in generating candidate pairs and reduces the memory and/or storage consumption needed for storing the signatures. At the same time this method guarantees that every pair of vectors (x,y) whose distance is smaller than a predefined threshold, k, will become a candidate pair; that is, it has a recall of 100%. The PartEnum method by Arasu et al., mentioned above, also has a recall of 100%, but requires more signatures for a predefined level of filtering.

An improved trade-off, between light filtering which produces many candidate pairs contra strong filtering which produces few candidate pairs, can be achieved especially for trade-offs that are attractive for a variety of applications of the computer-implemented method.

In some embodiments the first elements of the mask are non-masking elements and the second elements of the mask are masking elements. The non-masking elements may be represented by binary ones, whereas the masking elements may be represented by binary zeros. However, other binary (single-bit or multi-bit) representations or other data representations are foreseeable.

In the case that the set of masks comprises a configuration of the elements that is a Hadamard code or a permutation of a Hadamard code, for instance, for a filtering level (also denoted filtering probability) of approximately 0.01, an improvement of more than 150 times fewer signatures is obtained. Further, a filtering level of approximately 0.04 yields an improved performance of more than 54 times fewer signatures. This significant reduction of the number of signatures greatly improves processing performance of the computer-implemented method when run on a computer.

This improvement is illustrated in FIG. 2a, wherein the number of signatures is plotted along the ordinate, y-axis—on a logarithmic scale—as a function of the filtering level indicated along the abscissa, x-axis.

The filtering level can be expressed by the following approximation:

$$P = \left(1 - \frac{1}{2b}\right)^{d(q,x)}$$

which expresses the filtering probability P of finding a match, i.e., a candidate pair, wherein b is a parameter representing a number of partitions as explained below. The parameter b is set to b=1 when the signatures are not partitioned, that is: there is 1 partition comprising the full set of signatures. The function d(q,x) is a function that measures the distance between the first vector denoted q and the second vector denoted x. In some embodiments, the distance between q and x is set as a parameter which may be denoted k. The parameter k represents the number of accepted mismatches.

The parameter k is indicative of how many signatures that need to be generated: if the number of accepted mismatches is relatively high, relatively many masks need to be generated, but the advantage is that processing time needed to identify candidate pairs is reduced, and vice versa.

As mentioned above, the set of masks may comprise a configuration of the elements that is a permutation of a Hadamard code. For a permutation of the Hadamard code, the order of the elements (e.g. bits) in one mask is rearranged using the same permutation for other masks or all other masks. The performance using a set of masks that comprise a configuration of the elements that is a permutation of a Hadamard code is on par with the performance of a Hadamard code and the above examples of performance improvement also applies to a permutation of a Hadamard code.

In the case that the set of masks comprises a configuration of the elements that is a code that to some extent deviates from a Hadamard code or a permutation of a Hadamard code improved performance is still achieved. In connection therewith it should be noted that the masks can be made sparser by leaving out a fraction e.g. up to 40% of the non-masking elements in the mask (the 'ones'). This gives the advantage of decreasing the computation time for signatures, and will preserve the guarantee of a signature match up to k mismatches, but will decrease filtering efficiency. Simulations on random data show that when leaving out 30% of non-masking elements the filtering capacity is better than that of PartEnum for k larger than 8. FIG. 2c shows the result of the simulation for different values of k when leaving out 30% of non-masking elements.

It should be noted that a Hamming code may comprise a vector containing only zeros. In connection therewith it is noted that in some embodiments a mask containing only zeros (only masking elements) of a set of masks that conforms to a Hamming code is omitted i.e. effectively not included in the set of masks. The reason is that such a mask produces identical signatures for all vectors irrespective of their content. Further, in some embodiments, the very first column ($0^{th}$ coordinate in each vector) in the set of Hamming codes $H_k$ is effectively omitted from the set of masks since it may be 0 in all vectors of $H_k$ (confer below).

In some embodiments the first vector is a query vector, q, and the second vector, x, is a data vector comprised by multiple data vectors, that constitutes a dataset, are all processed in the same way as the second vector. The multiple vectors may be stored in a memory and/or in a data storage, e.g. in a database.

In some embodiments the first vector and the second vector agree in size in the sense that they have the same number of elements.

In some embodiments the first vector is a query vector, which is an approximate dictionary query, which requires that the size of the query and data agrees, i.e., they have the same length or number of elements.

It should be noted that a mask, when applied, for a given element of the first vector or the second vector either transfers the element from a vector to a signature or inserts a blank element to the signature; that is the mask is applied to blank out predefined elements as set forth above. The blank element may be represented to conform to predefined convention. In case the vectors comprise strings of characters, the blank element may be represented by a special character or symbol. In case of binary vectors the blank element may be represented by a 'zero'.

In one definition the $k^{th}$ Hadamard code is a collection $H_k = \{x_v | v \text{ in } \{0,1\}^k\}$ of $2^k$ vectors, wherein the ith bit of $x_v$ is 1 if and only if p=i & v has an odd number of bits set to 1, wherein i is interpreted as a k-bit binary number and & is the bitwise conjunction operator.

In embodiments, wherein the masks, vectors and signatures are partitioned, each partition of the masks is configured as a Hadamard code $H_{int(k/b)+1}$, wherein int(k/b) expresses the integer part of the fraction k/b.

It should be noted that several engineering details that would be understood by a person skilled in the art have been left unspecified. For example, a variety of indexing and join techniques can aid in expediting candidate pair generation. Also, candidate pairs can be generated in a so-called pipelined fashion.

In some embodiments the first vector and the second vector agree in size and each mask agrees in size with the first vector and the second vector.

Truncation of one or both of the first vector or the second vector may be applied to make the vectors agree in size, alternatively one or both of the first vector or the second vector may be padded with additional elements to make the vectors agree in size. Alternatively, one or both of the first vector or the second vector may be configured with a predefined size that is appropriate for representing data contents.

In some embodiments the set of masks is arranged as multiple partitions that each spans a fraction of the first vector or the second vector and collective spans the full size of the first vector or the second vector.

Generally, when the set of masks is arranged as multiple partitions, there is need for fewer masks, which reduces the amount of signatures that needs to be computed.

In some embodiments, the number of partitions is chosen such that statistically at least one mismatch occurs in each partition. In some cases it can be assumed that the number of mismatches per partition is $$\frac{k}{b}$$

wherein b is the number of partitions and k is the number of allowed mismatches. In some embodiments, statistically, at least $$\frac{k}{b}$$

mismatches occur in each partition, wherein $$\frac{k}{b} = 1, 2, 3, 4$$

or up to 10 or up to 20 or 30 mismatches per partition.

In some embodiments partitions are arranged with mutual overlaps such that for elements in the first vector and/or the second vector, each element is represented in multiple partitions, but to not in all partitions.

Thereby a further improved trade-off is provided in the sense that it is possible to more accurately adjust the number of masks needed Conventionally, having for instance 3 partitions meant that each element in the vectors was represented in 1 out of those 3 partitions. By the further improved trade-off each element for at least some elements in the first vector and/or second vector is represented in for example 2 out of 3 partitions, in which case there will be some partition having at most ⅔ of the errors, if the errors are uniformly distributed. Using this or other fractions of overlaps such as ¾ or ⅖ means that the number of masks needed can be more accurately set.

In some embodiments a number of t masks are generated, wherein t is expressed as:

$$t = (2^{k/b+1} - 1) \pm d$$

wherein b is a number of partitions, k is a number of allowed mismatches, and d is a relative deviation selected from the group of: 5%, 10%, 15% and 20%. This number of masks is sufficient to achieve the improved performance. However, the set of masks may comprise masks in addition to the configurations mentioned above. Such additional masks will generally, however, not improve performance. In case the fraction k/b is not an integer k/b may be replaced by k/b rounded down to the nearest integer.

In some embodiments the set of masks comprises a configuration of the elements that is a code that deviates from a Hadamard code or a permutation of a Hadamard code in accordance with one of the following:
in less than 40% of its elements for k≥18,
in less than 30% of its elements for k≥8,
in less than 20% of its elements for k≥5,
in less than 10% of its elements for k≥4;
wherein k is a number of allowed mismatches.

In some embodiments the set of masks and the first vector and the second vector are arranged in respective multiple partitions; and wherein each or at least a majority of the partitions of the set of masks comprises a configuration of the elements that is one or more of the following:

a Hadamard code;
a permutation of a Hadamard code;
a code that deviates from a Hadamard code or a permutation of a Hadamard code in less than 40% of its elements.

Consequently, far less signatures are needed for the same performance.

In some embodiments the computer-implemented method comprises: computing a distance measure for respective candidate pairs; looking up the first vector and the second vector that produced the signatures of the respective candidate pair; wherein the distance measure is computed to represent the distance between the looked-up the first vector and the second vector that produced the signatures of the respective candidate pair.

Distance measures are generally known by a person skilled in the art. In some embodiments the distance measure counts the number of elements where the first vector and the second vector have differing values. The distance measure is e.g. the Hamming distance measure.

In some embodiments the second vector is a data vector comprised by multiple data vectors that constitute a dataset; comprising: computing an index that links a signature to the vector that was applied to a mask to generate the signature; and using the index to identify the vector that was applied to a mask to generate the signature in an identified candidate pair.

Consequently, one or more of the first vector or the second vector can be looked up quickly. In some embodiments an index in applied to look up data vectors from candidate pairs quickly. In some embodiments the index comprises a hash table, wherein the index values are computed by a hash function or an alternative index generating function.

Especially, in connection with distance computation between the first vector and the second vector for each candidate pair, the addition of an index greatly speeds up the process of retrieving the data vector and/or query vector, associated with signatures of a candidate pair, for computing the distance measure.

In some embodiments the computer-implemented method comprises: generating a predefined permutation scheme for elements in either the query vector or the data vector; and generating a permutation of the query vector and generating a permutation of the data vector using the same predefined permutation scheme.

The purpose of making permutations is to distribute occurrences of 'mismatches' across the vector or signature or partitions thereof.

It should be noted that if the data and query are already distributed such that mismatches are expected to occur with under a uniform distribution across the vector or signature, the step of generating permutations can be dispensed with without degrading performance.

In some embodiments the permutation scheme is generated randomly or pseudo-randomly. In other embodiments the permutation scheme is configured to change the distribution of mismatches in a predefined way.

In some embodiments the first vector is received via a user interface such as a user interface accessible via the Internet.

There is also provided a computer system loaded with a computer program configured to perform the computer-implemented method as claimed in any of the preceding claims.

There is also provided a computer-readable medium carrying a program configured to perform the computer-implemented method as claimed in any of the preceding claims when run on a computer.

There is also provided a data structure configured to store the signatures generated by the computer-implemented method of any of the preceding claims.

There is also provided a computer configured in one or both of hardware or software for processing a first vector and a second vector, comprising one or more components configured to: receive the first vector and the second vector; generate a set of masks; wherein each mask agrees in size with the first vector and the second vector; and wherein the set of masks comprises first elements and second elements; generate a first set of multiple signatures and a second set of multiple signatures by applying the set of masks to the first vector and the second vector, respectively; generate candidate pairs, of a first signature and a second signature, by identifying matches of a first signature and a second signature; wherein the set of masks comprises a configuration of the elements that is one or more of the following:

a Hadamard code;
a permutation of a Hadamard code;
a code that deviates from a Hadamard code or a permutation of a Hadamard code in less than 40% of its elements.

Here and in the following, the terms 'component', is intended to comprise any circuit and/or device suitably adapted to perform the functions described herein. In particular, the above term comprises general purpose or proprietary programmable microprocessors, Digital Signal Processors (DSP), Application Specific Integrated Circuits (ASIC), Programmable Logic Arrays (PLA), Field Programmable Gate Arrays (FPGA), special purpose electronic circuits, etc., or a combination thereof.

In general a computer program configured to perform the computer-implemented method shall mean any program configured to perform the computer-implemented method such as combinations of programs.

A computer-readable medium carrying a program configured to perform the computer-implemented method shall mean any medium such as a memory device or storage device comprising a so-called cloud system.

BRIEF DESCRIPTION OF THE FIGURES

A more detailed description follows below with reference to the drawing, in which.

DETAILED DESCRIPTION

Figure 1:
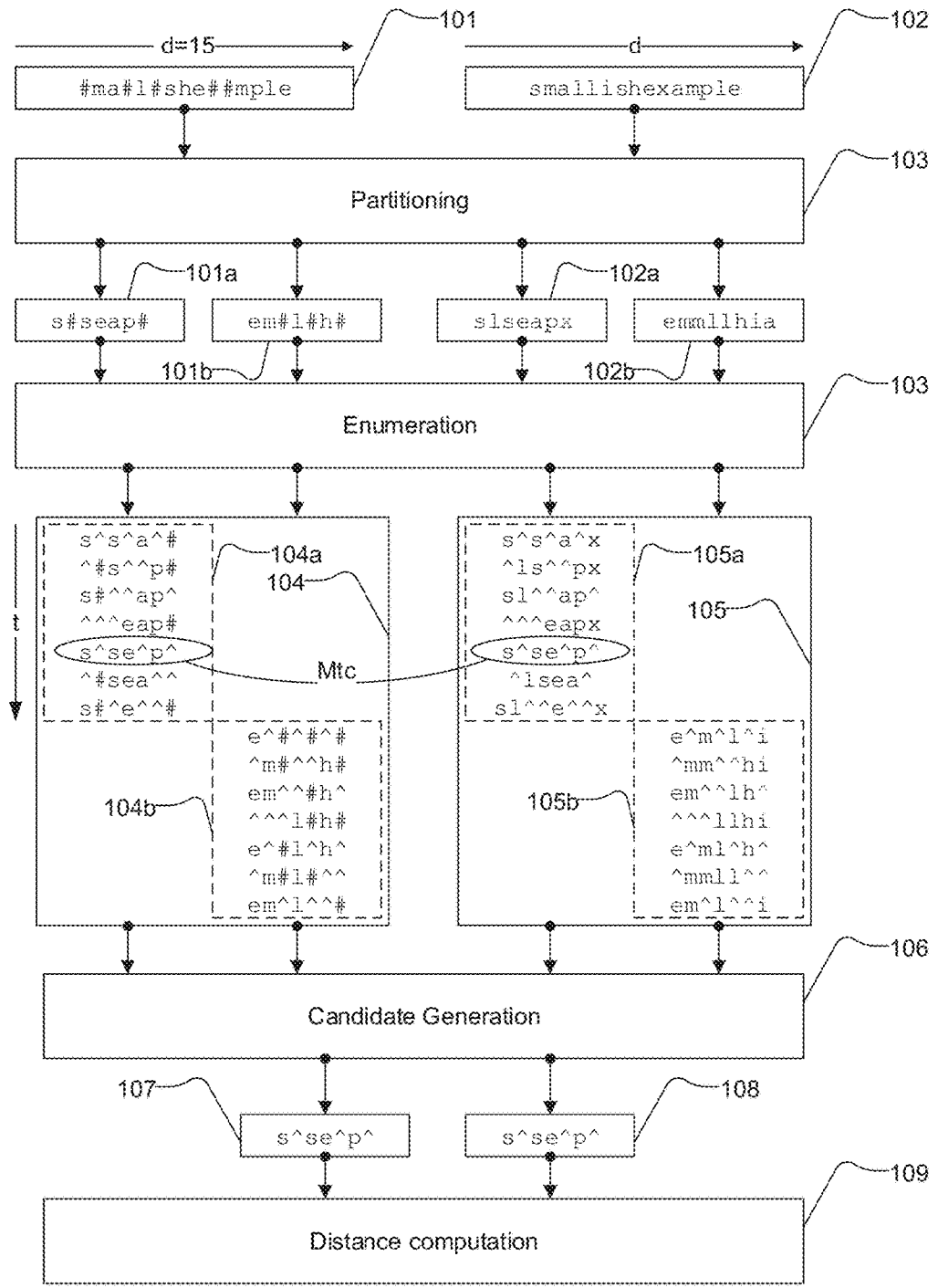
FIG. 1 shows an example flow of computing similarity joins.

FIG. 1 shows an example flow of performing a search using signatures. In this example flow the first vector 101 has a length d=15 and comprises 15 elements holding 15 characters. The second vector 102 also has a length d=15 and comprises 15 elements holding 15 characters. The first vector and the second vector then agree in size.

Albeit a simple example, the first vector 101 is considered a query vector and the second vector 102 is considered a data vector. The vectors 101 and 102 contain in this example the following characters:

| Pos: | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| 101: | # | m | a | # | l | i | s | h | e | # | # | m | p | l | e |

| Pos: | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| 102: | s | m | a | l | l | i | s | h | e | x | a | m | p | l | e |

The '#' character explicitly represents the positions of mismatches between the query vector and the data vector, in order to make it easier to follow the example. We note that such a representation is also convenient if the positions of where the mismatches may occur are known. If the positions of the mismatches are not known, use of special characters for that purpose can be dispensed with.

Typically the second vector 102 is comprised by multiple data vectors that constitute a dataset. Such a data set may comprise any number of vectors such as hundreds, thousands, millions, billions or an even higher number of data vectors.

The query vector and the data vector are partitioned in step 103 into smaller partitions. In this example the number of partitions is b=2, which means that the query vector and the data vector each are partitioned into b=2 partitions. Thus the first vector 101 is partitioned into partitions 101a and 101b, and the second vector 102 is partitioned into partitions 102a and 102b.

Additionally, a predefined permutation scheme is used for generating a permutation of the query vector and generating a permutation of the data vector using the same predefined permutation scheme. In this example case, the predefined permutation scheme is represented in the following way:

| | | |
|---|---|---|
| 1 → 3 | 6 → 14 | 6 → 14 |
| 2 → 9 | 7 → 1 | 7 → 1 |
| 3 → 5 | 8 → 13 | 8 → 13 |
| 4 → 2 | 9 → 4 | 9 → 4 |
| 5 → 11 | 10 → 7 | 10 → 7 |

In this representation of the permutation scheme, arrows indicate that the content of a first element position on its left side is repositioned to a second element position as indicated on the right side of the arrow; e.g. element number 1 in the query vector or the data vector is repositioned to be element number 3.

Using this permutation scheme the content of the above vectors 101 and 102 becomes:

| Pos: | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| 101: | s | # | s | e | a | p | # | e | m | # | l | # | h | 3 | |

| Pos: | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| 102: | s | l | s | e | a | p | x | e | m | m | l | l | h | i | a |

The partitioning then partitions the vectors by splitting them into b=2 partitions, 101a and 101b:

| Pos: | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| 101a: | s | # | s | e | a | p | # | | | | | | | | |

| Pos: | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| 101b: | | | | | | | | e | m | # | l | # | h | 3 | | and 102a and 102b:

| Pos: | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| 102a: | s | l | s | e | a | p | x | | | | | | | | |

| Pos: | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| 102b: | | | | | | | | e | m | m | l | l | h | i | a |

The partitions 101a, 101b and 102a, 102b are then input to an enumeration step, which expands the vectors into respective sets of signatures 104 and 105 by means of a set of t masks (not shown). The set of masks may conform to a Hadamard code definition, wherein zeros represent elements not to transfer from a vector and onto the signature, and ones represent elements to transfer from a vector and onto the signature, such that the element becomes part of the signature.

A mask in the set of masks may span the full length of the vectors or span the full length of a partition; it is shown that a mask spans the full length of each of the b=2 partitions. In this example the set of masks count t=7 masks. For the sake clarity, elements in the signature represented by the character '^' (the escape character) represents blank elements, which are elements corresponding to masking elements in a respective mask i.e. elements which the mask didn't transfer from the vector to the signature.

The enumeration step 103 is illustrated below for one of the partitions; wherein the data vector partition 102a is shown as the topmost square, followed by the mask and bottommost: the signature.

| Data vector 102a: | s | l | s | e | a | p | x |
|---|---|---|---|---|---|---|---|
| Mask: | 1 | 0 | 1 | 0 | 1 | 0 | 1 |
| | 0 | 1 | 1 | 0 | 0 | 1 | 1 |
| | 1 | 1 | 0 | 0 | 1 | 1 | 0 |
| | 0 | 0 | 0 | 1 | 1 | 1 | 1 |
| | 1 | 0 | 1 | 1 | 0 | 1 | 0 |
| | 0 | 1 | 1 | 1 | 1 | 0 | 0 |
| | 1 | 1 | 0 | 1 | 0 | 0 | 1 |

| Signature: | s | | s | | a | | x |
|---|---|---|---|---|---|---|---|
| | | L | s | | | p | x |
| | s | l | | | a | p | |
| | | | | e | a | p | x |
| | s | | s | e | | p | |
| | | l | s | e | a | | |
| | s | l | | e | | | x |

Reverting to FIG. 1, in this example, the signature partitions 104a and 104b from respective partitions of the query vector are arranged in continuation of each other however, it is clear that various representations on a computer are foreseeable.

The sets of signatures 104 and 105 comprising any partitions thereof may be stored in a dedicated memory and/or data storage.

The step 106 of performing candidate generation uses the sets of signatures 104 and 105 to perform exact searches for one or more matching pairs of signatures from the first set of signatures 104 and the second set of signatures 105. A match identified by the step 106 of performing candidate generation is, in this example, is illustrated by two ellipses connected by the line designated Mtc. However, it should be noted that multiple matches may be identified since a predefined level of mismatches is allowed. Thus, multiple matches resulting from the one and same data vector or resulting from multiple data vectors may be identified. The matching signatures are shown as 107 and 108.

Distance computation step 109 tracks the first vector 101 and the second vector 102 from the candidate pair, i.e. the matching signatures 107 and 108, and computes a distance measure between the two vectors. The distance measure may be a Hamming distance or another distance measure. In this simple example it is trivial to identify the first vector 101 and second vector 102 from the respective signatures 107 and 108. However, when the computer-implemented method operates on a multitude of vectors it can be convenient to compute an index for the multitude of data vectors. The index may be computed and stored at the same time or in the same process when the signatures are computed. Consequently, a data vector corresponding to a candidate pair can be looked up quickly. In some embodiments the index is a hash table, wherein the index values are computed from by a hash function or an alternative index generating function. Especially, in connection with distance computation in step 109, the addition of an index greatly speeds up the process of retrieving the data vector associated with signatures of a candidate pair, for computing the distance measure.

The distance computation in step 109 may complete the computer-implemented method and point to those data vectors that have a distance measure relative to the query vector below a threshold value or point to the data vectors for which there is identified a candidate pair in a ranked order of distance e.g. in increasing or decreasing order.

The above-mentioned set of masks can be chosen as a Hadamard code. The $k^{th}$ Hadamard code is the collection $H_k = \{x_v | v \text{ in } \{0,1\}^k\}$ of $2^k$ vectors, wherein the $i^{th}$ bit of $x_v$ is 1 if and only if p=i & v has an odd number of bits set to 1, wherein i is interpreted as a k-bit binary number and & is the bitwise conjunction operator (AND-operator). To compute the $i^{th}$ bit of the Hadamard code word indexed by the vector v, the bitwise conjunction operator (AND operator) is applied to v and i, and the number of bits set to 1 is computed using a so-called popcnt( ) instruction. The bit is then extracted as the least significant bit of the count. In programming languages such as C this entire computation can be expressed as: popcnt(v & i) & 1, wherein popcnt( ) is a function that counts number of ones (1). In connection therewith it is noted that in some embodiments a mask containing only zeros (only masking elements) of a set of masks that conforms to a Hamming code is omitted i.e. effectively not included in the set of masks. The reason is that such a mask produces identical signatures for all vectors irrespective of their content. Further, in some embodiments, the very first column ($0^{th}$ coordinate in each vector) in the set of Hamming codes $H_k$ is effectively omitted from the set of masks since it may be 0 in all vectors of $H_k$ (confer below).

In some embodiments, the vectors and the masks are configured to have the same length. Then the number of masks needed is $2^{k+1}$ wherein k is the number of errors accepted in a partition; that is $$\frac{k}{b}$$

errors are accepted in each partition, wherein b is the number of partitions; thus the number of masks needed is $2^{k+1}$.

In some embodiments the vectors, be it a data vector and/or a query vector, or at least one of them, are shorter than the mask, and padding elements are added to the at least one vector to make its length agree with the length of the mask.

In some embodiments, the vectors be it a data vector and/or a query vector, or at least one of them, are longer than mask and each mask element or at least one of them is then configured to handle multiple elements of the data vector and/or query vector. That is, each mask element may mask out or transfer multiple vector elements.

In case, the vectors and the masks do not agree in length, any combination of the above embodiments may be employed to accommodate vectors and masks that do not agree in length.

Figure 2A:
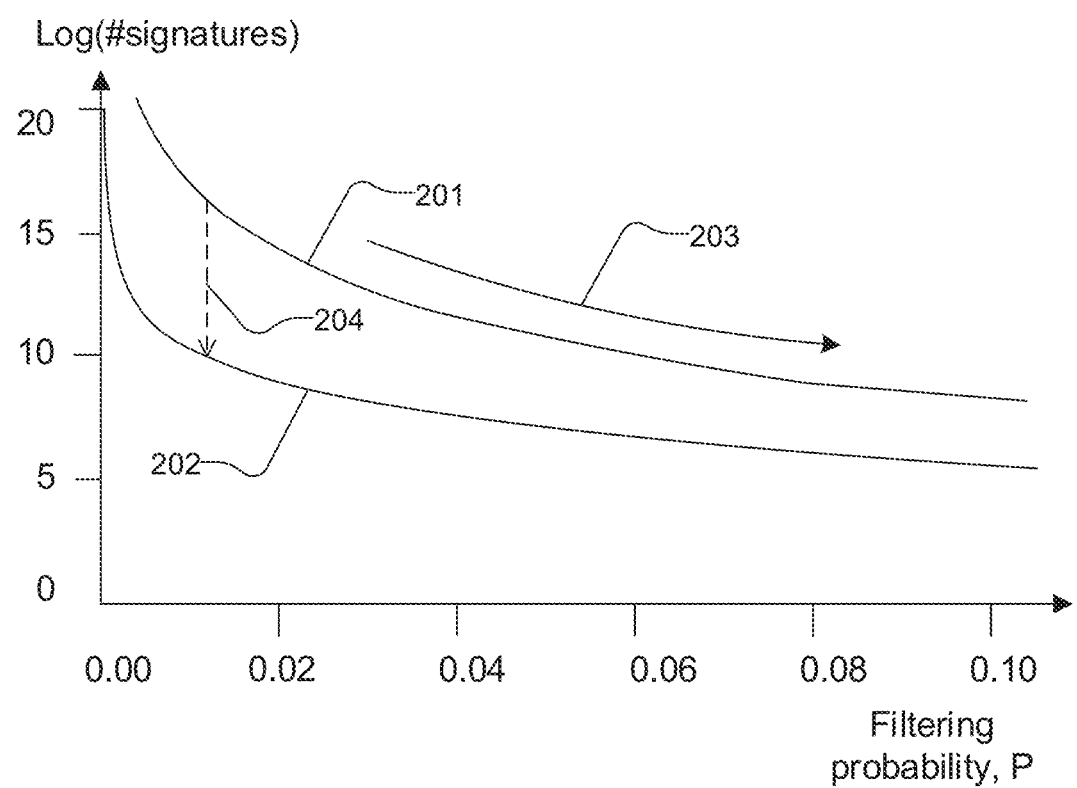
FIG. 2a shows a performance curve showing an improvement over a signature-based method using partitioning.

FIG. 2a shows a performance curve showing an improvement over a signature-based method using partitioning. The Cartesian coordinate system shows a first performance curve 201 representing a prior art method as suggested in Arasu et al. in U.S. Pat. No. 7,865,505 and a second performance curve 202 representing an improved method as suggested herein. The abscissa (x-axis) shows a normalized filtering probability, P, and the ordinate (y-axis) shows the logarithm to the number of signatures generated.

The filtering probability, P, can be expressed by the following the approximation:

$$P = \left(1 - \frac{1}{2b}\right)^{d(q,x)}$$

which expresses the probability per mask P of finding a match i.e. a candidate pair, wherein b is a parameter representing a number of partitions and d (q,x) is the number of mismatches between the query vector, q, and the data vector, x, that generated the signature in the candidate pair via the mask. The number of mismatches may be measured as the Hamming distance. The plot in FIG. 2 is shown for a fixed distance measured by d(q,x).

The slightly curved, right hand side pointing arrow 203 shows the progression of the performance curves 202 and 203 as the number of partitions increases.

The dashed line 204 shows the improvement of the method disclosed herein in terms of the number of signatures to be generated.

The improved method yields an improved trade-off between the number of masks and the filtering efficiency that improves the one achieved by Arasu et al. In general, the trade-off is controlled by the number of partitions in the partitioning step: More partitions decrease the number of masks required, but also decreases the filtering efficiency.

In a given application to a data set, the number of partitions should be chosen to balance the cost of generating all signatures (which is proportional to the number of masks) and the cost of false positives (determined by the filtering efficiency).

It should be noted that the filtering probability decreases exponentially with the distance $d(q,x)$ between the first vector x and the second vector q. The rate of decrease (i.e. with respect to FIG. 2a: towards 0.00 along the abscissa, x-axis) depends on the number of partitions—the fewer partitions the faster decrease.

The effect of changing the number of partitions represented by b (and hence number of signatures) on filtering level is that the rate of decrease is slower for larger values of b (more partitions).

Figure 2B:
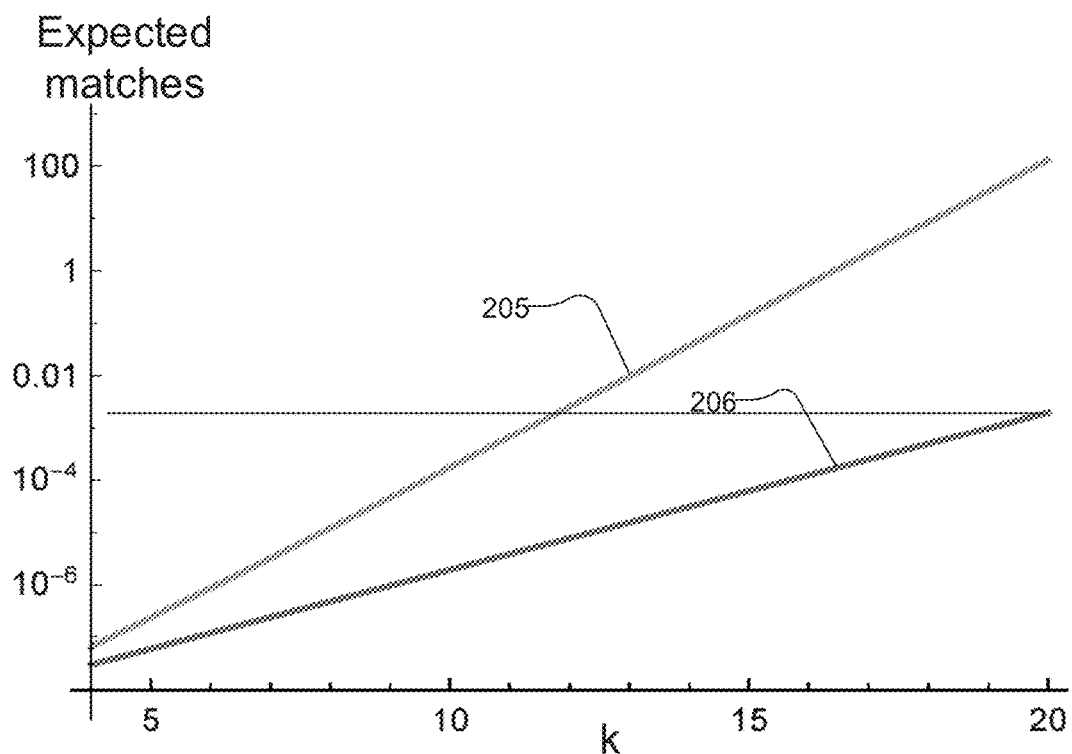
FIGS. 2b and 2c show the number of expected matches as a function of the number of allowed mismatches.
Figure 2C:
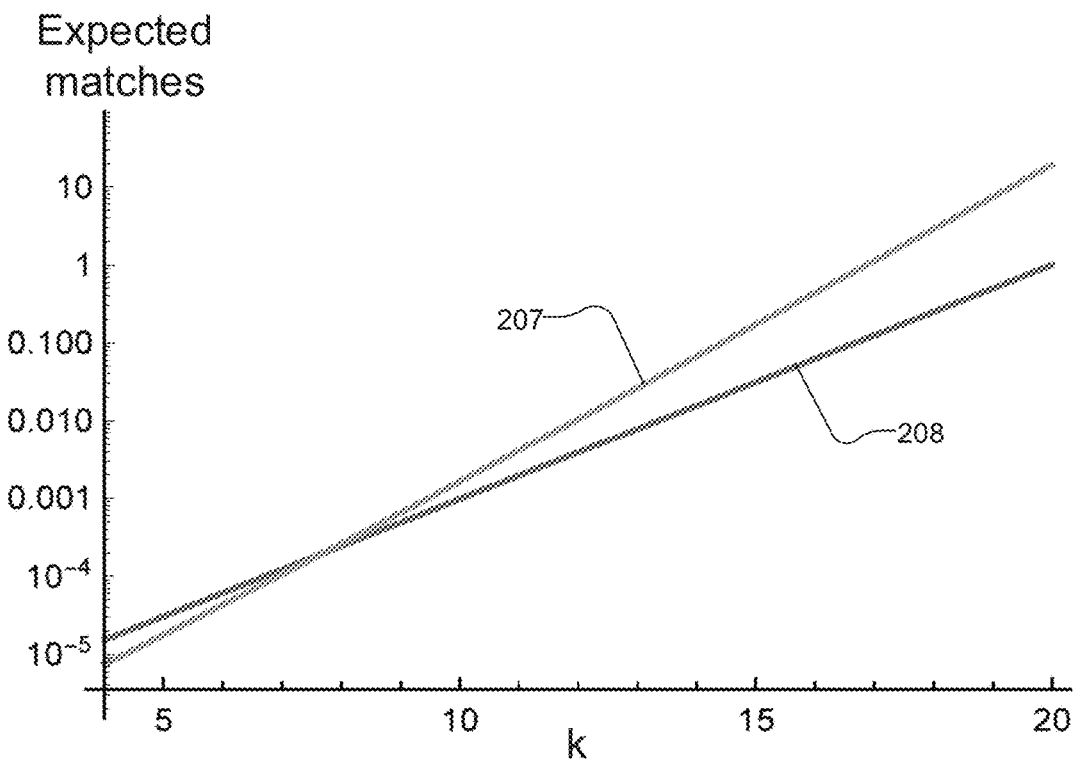

FIGS. 2b and 2c show the number of expected matches as a function of the number of allowed mismatches. Both in FIG. 2b and FIG. 2c the abscissa indicates the number of allowed mismatches, k, and the ordinate indicates the number of expected matches (i.e. candidate pairs) per data vector.

The curves 205 and 207 show the performance of the PartEnum prior art approach by Arasu et al., whereas the curves 206 and 208 show the performance of the improved method.

In FIG. 2b the curve 206 for the improved method is drawn up using a set of masks that fully comply with a Hadamard code configuration or permutations of a Hadamard code. As can be seen the improved method performs better for a broad range of mismatches since generally fewer candidate pairs are generated per data vector.

In FIG. 2c the curve 208 for the improved method is drawn up using a set of masks that comply with a code that deviates from a Hadamard code or a permutation of a Hadamard code in about 30% of its elements, since 30% of the non-masking elements are replaced by masking elements. As can be seen the improved method performs better for a broad range of mismatches for $k \geq 8$ since fewer candidate pairs are generated per data vector. For a deviation of 30% and for $k<8$ the improved method performs only marginally poorer than Arasu et al. when their masks are similarly modified by reducing the number of non-masking elements by 30%. The improved method is therefore a good alternative.

Figure 3:
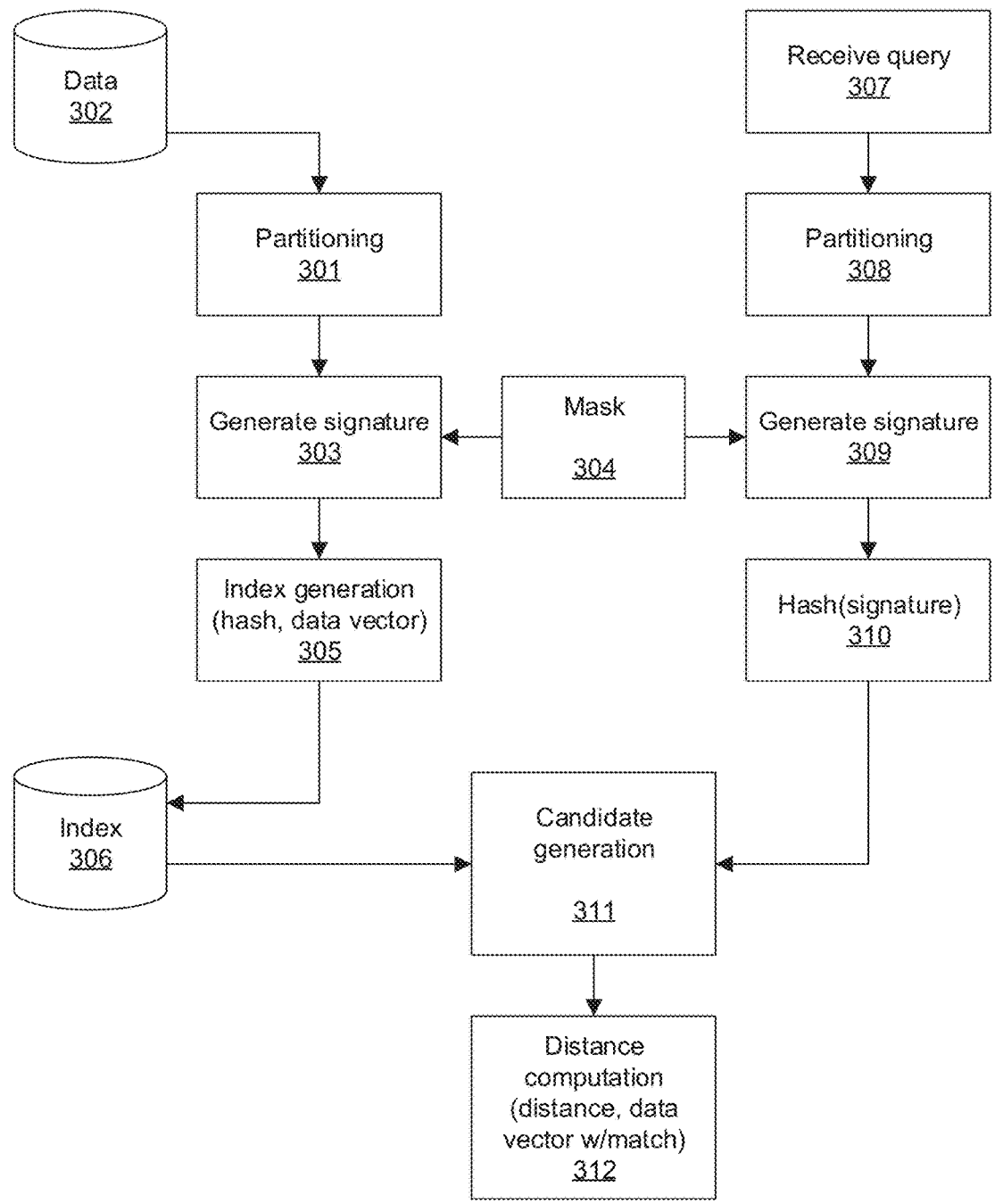
FIG. 3 shows a flowchart of processing a query.

FIG. 3 shows a flowchart of processing a query. Before processing a query a set of masks conforming to a Hadamard code are generated and stored in step 304. Step 303 then performs generation of signatures by applying the set of masks to data vectors stored in a data repository 302 e.g. in the form of a database. Optionally, data may be partitioned in step 301 as explained in connection with FIG. 1. While signatures are generated or as a subsequent step an index that links a signature to the vector that was applied to a mask in the set of masks to generate the signature is generated in step 305. The index is stored in a repository 306 in connection with the data repository 302.

A query is received in step 307 and in case partitioning is applied the query is partitioned in step 308 to conform to the partitioning applied to the data in step 301. The set of masks generated in step 304 are applied to the query or the partitioned query to generate query signatures in step 309. In connection therewith or as a subsequent step 310 computes a hash value of the signature.

In step 311 data signatures generated in step 303 are matched with query signatures generated in step 309. Matching signature pairs of data signatures and query signatures are identified.

In step 312 the data vector and the query vector that generated the signature via mask is looked up via the computed index. Further, a distance measure is computed for the data vector and the query vector.

Data vectors that generated a signature in a candidate pair may be presented in an order according to a value of the distance measure. In some embodiments data vectors are filtered such that data vectors with a distance measure relative to the query vector that satisfied as threshold criterion are presented separately.

Figure 4:
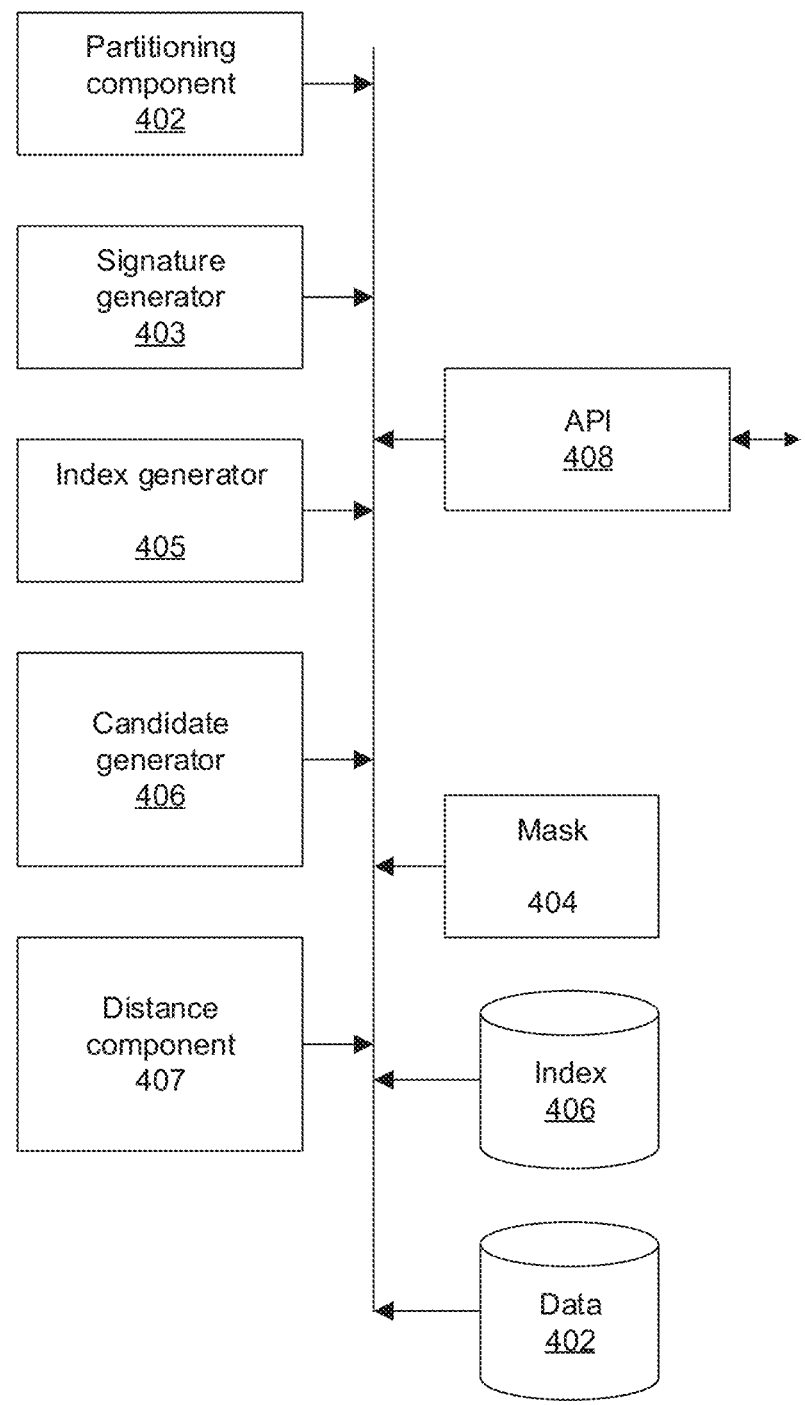
FIG. 4 shows the structure of a system for processing a query.

FIG. 4 shows the structure of a system for processing a query. The system is accessed via a so-called Application Programmable Interface, API, 408. The API is configured to:
receive a query vector,
initiate candidate generation,
initiate distance computation,
present or retrieve candidates comprising signature candidates, and
present or retrieve data vectors comprising optionally ranking the data vectors according to the computed distance measure, The API is also configured to:
initiate generation of a set of masks,
initiate generation of an index,
configure a set of masks,
configure partitions, Additionally, the API may be configured to set up and initiate connection to a database 402 wherein the data vectors are stored.

The API accesses a collection of software components that are configured to perform the operations described in connection with the flowcharts. The software components may be configured in according to an object oriented structure. The software components comprise a partitioning component 402, a signature generator 403, an index generator 405, a candidate generator 406, a distance computing component 407, and a storage 404 for storing the set of masks.

A database 402 stores the data vectors and the index 406.

In some embodiments the computer-implemented method is implemented in a general purpose computer such as a general purpose server computer or a server computer dedicated to database and search operations.

Although a software based approach has been described in the above, it should be noted that portions or the entire system may be implemented in hardware.

The invention claimed is:

1. A computer-implemented method of processing a first vector representing a query, and a second vector, representing data stored in a digital database, the method comprising:
receiving the first vector from an input to a computer or from a digital database and the second vector from a digital database or from an input to a computer;
generating, using the computer, a set of masks; wherein the set of masks comprises first elements and second elements;
generating, using the computer, a first set of multiple signatures and a second set of multiple signatures by applying the set of masks to the first vector and the second vector, respectively;

generating, using the computer, candidate pairs, of a first signature and a second signature, by identifying matches of a first signature and a second signature so that every pair of the first and second vectors whose mismatch is smaller than a predefined threshold becomes a candidate pair;

wherein the set of masks is arranged as multiple partitions so that each mask spans a fraction of the first vector or the second vector and the masks collectively span the full size of the first vector or the second vector, wherein a number of t masks are generated, wherein t is expressed as: $t=(2^{k/b+1}-1)\pm d$ where b is a number of partitions, k is a number of allowed mismatches, and d is a relative deviation selected from the group of: 5%, 10%, 15% and 20%, and wherein the set of masks comprises a configuration of the elements that is one or more of the following:

a Hadamard code;

a permutation of a Hadamard code;

a code that deviates from a Hadamard code or a permutation of a Hadamard code in less than 40% of its elements.

2. A computer-implemented method according claim 1, wherein the first vector and the second vector agree in size; and wherein each mask agrees in size with the first vector and the second vector.

3. A computer-implemented method according to claim 1, wherein partitions are arranged with mutual overlaps such that for elements in the first vector and/or the second vector, each element is represented in multiple partitions, but not in all partitions.

4. A computer-implemented method according to claim 1, wherein the set of masks comprises a configuration of the elements that is a code that deviates from a Hadamard code or a permutation of a Hadamard code in accordance with one of the following:

in less than 40% of its elements for k≥18,
in less than 30% of its elements for k≥8,
in less than 20% of its elements for k≥5,
in less than 10% of its elements for k≥4;

wherein k is a number of allowed mismatches.

5. A computer-implemented method according to claim 1, wherein the set of masks and the first vector and the second vector are arranged in respective multiple partitions; and wherein each or at least a majority of the partitions of the set of masks comprises a configuration of the elements that is one or more of the following:

a Hadamard code;

a permutation of a Hadamard code;

a code that deviates from a Hadamard code or a permutation of a Hadamard code in less than 40% of its elements.

6. A computer-implemented method according to claim 1, comprising the steps of:

computing a distance measure for respective candidate pairs;

looking up the first vector and the second vector that produced the signatures of the respective candidate pair;

wherein the distance measure is computed to represent the distance between the looked-up the first vector and the second vector that produced the signatures of the respective candidate pair.

7. A computer-implemented method according to claim 1; wherein the second vector is a data vector comprised by multiple data vectors that constitute a dataset; comprising:

computing an index that links a signature to the vector that was applied to a mask to generate the signature; and using the index to identify the vector that was applied to a mask to generate the signature in an identified candidate pair.

8. A computer-implemented method according to claim 1, comprising:

generating a predefined permutation scheme for elements in either the query vector or the data vector; and generating a permutation of the query vector and generating a permutation of the data vector using the same predefined permutation scheme.

9. A computer-implemented method according to claim 1 wherein the first vector is received via a user interface such as a user interface accessible via the Internet.

10. A computer system loaded with a computer program configured to perform the computer-implemented method as claimed in claim 1.

11. A non-transitory computer-readable medium carrying a program configured to perform the computer-implemented method as claimed in claim 1 when run on a computer.

12. A non-transitory computer-readable medium carrying data structure configured to store the signatures generated by the computer-implemented method of claim 1.

13. A computer configured in one or both of hardware or software for processing a first vector, representing a query, and a second vector, representing data stored in a digital database, the computer comprising one or more components configured to:

receive the first vector from an input to the computer or from a digital database and the second vector from a digital database or from an input to the computer;

generate a set of masks; wherein each mask agrees in size with the first vector and the second vector; and wherein the set of masks comprises first elements and second elements;

generate a first set of multiple signatures and a second set of multiple signatures by applying the set of masks to the first vector and the second vector, respectively;

generate candidate pairs, of a first signature and a second signature, by identifying matches of a first signature and a second signature so that every pair of the first and second vectors whose mismatch is smaller than a predefined threshold becomes a candidate pair;

wherein the set of masks is arranged as multiple partitions so that each mask spans a fraction of the first vector or the second vector and the masks collectively span the full size of the first vector or the second vector, wherein a number of t masks are generated, wherein t is expressed as: $t=(2^{k/b+1}-1)\pm d$ where b is a number of partitions, k is a number of allowed mismatches, and d is a relative deviation selected from the group of: 5%, 10%, 15% and 20%, and wherein the set of masks comprises a configuration of the elements that is one or more of the following:

a Hadamard code;

a permutation of a Hadamard code;

a code that deviates from a Hadamard code or a permutation of a Hadamard code in less than 40% of its elements.

* * * * *